(12) United States Patent
Frosien

(10) Patent No.: US 9,589,763 B1
(45) Date of Patent: Mar. 7, 2017

(54) METHOD FOR DETECTING SIGNAL CHARGED PARTICLES IN A CHARGED PARTICLE BEAM DEVICE, AND CHARGED PARTICLE BEAM DEVICE

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT INTEGRATED CIRCUIT TESTING GESELLSCHAFT FÜR HALBLEITERPRÜFTECHNIK MBH, Heimstetten (DE)

( * ) Notice: Subject to any disclaimer, the term of this patent is extended or adjusted under 35 U.S.C. 154(b) by 0 days.

(21) Appl. No.: 14/932,443

(22) Filed: Nov. 4, 2015

(51) Int. Cl.
*H01J 37/28* (2006.01)
*H01J 37/147* (2006.01)
*H01J 37/26* (2006.01)

(52) U.S. Cl.
CPC .......... *H01J 37/147* (2013.01); *H01J 37/261* (2013.01)

(58) Field of Classification Search
USPC ....................................................... 250/307
See application file for complete search history.

(56) References Cited

U.S. PATENT DOCUMENTS

| | | | | |
|---|---|---|---|---|
| 6,593,152 B2 * | 7/2003 | Nakasuji | ............... | G01N 23/225 250/492.3 |
| 6,992,290 B2 * | 1/2006 | Watanabe | ............. | H01J 37/224 250/310 |
| 7,253,645 B2 * | 8/2007 | Talbot | ................... | G06T 7/0004 250/310 |
| 9,336,984 B2 * | 5/2016 | Bizen | ...................... | H01J 37/28 |

* cited by examiner

*Primary Examiner* — Phillip A Johnston
(74) *Attorney, Agent, or Firm* — Kilpatrick Townsend & Stockton LLP

(57) ABSTRACT

The present disclosure provides a method for detecting signal charged particles in a charged particle beam device. The method includes emitting a primary charged particle beam, illuminating a specimen with the primary charged particle beam, wherein the primary charged particle beam has a landing energy on the specimen of less than 40 keV, wherein signal charged particles with a first energy spectrum are generated, energy filtering the signal charged particles such that signal charged particles in an energy range from an energy of 85% of the landing energy to 100% propagate for subsequent detection, and detecting the signal charged particles within the energy range using at least one detector.

15 Claims, 5 Drawing Sheets

METHOD FOR DETECTING SIGNAL CHARGED PARTICLES IN A CHARGED PARTICLE BEAM DEVICE, AND CHARGED PARTICLE BEAM DEVICE

FIELD

Embodiments of the present disclosure relate to a method for detecting signal charged particles in a charged particle beam device, and a charged particle beam device. Embodiments of the present disclosure particularly relate to charged particle beam devices, for example, for inspection of 3D structures.

BACKGROUND

Charged particle beam devices can be used in, for example, electron beam inspection, critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to their short wavelengths.

Imaging of 3D structures, such as deep vias, has been conducted. When imaging 3D structures, a high resolution and a high throughput of the charged particle beam device are beneficial. However, the number of signal charged particles that can be collected and detected can be small. A resolution and efficiency of the charged particle beam device can be reduced.

In view of the above, new methods for detecting signal charged particles in a charged particle beam device and charged particle beam devices that overcome at least some of the problems in the art are beneficial. In particular, methods and charged particle beam devices providing an improved detection of signal charged particles are beneficial.

SUMMARY

In light of the above, a method for detecting signal charged particles in a charged particle beam device and a charged particle beam device are provided. Further aspects, benefits, and features of the present disclosure are apparent from the claims, the description, and the accompanying drawings.

According to an aspect of the present disclosure, a method for detecting signal charged particles in a charged particle beam device is provided. The method includes emitting a primary charged particle beam, illuminating a specimen with the primary charged particle beam, wherein the primary charged particle beam has a landing energy on the specimen of less than 40 keV, wherein signal charged particles with a first energy spectrum are generated, energy filtering the signal charged particles such that signal charged particles in an energy range from an energy of 85% of the landing energy to 100% propagate for subsequent detection, and detecting the signal charged particles within the energy range using at least one detector.

According to another aspect of the present disclosure, a method for detecting signal charged particles in a charged particle beam device is provided. The method includes emitting a primary charged particle beam, illuminating a specimen with the primary charged particle beam, wherein the primary charged particle beam has a landing energy on the specimen of less than 40 keV, wherein signal charged particles with a first energy spectrum are generated, and wherein the signal charged particles are backscattered electrons, performing an aberration correction of at least a portion of the signal charged particles, and detecting the aberration corrected portion of the signal charged particles using at least one detector.

According to an aspect of the present disclosure, a charged particle beam device is provided. The charged particle beam device includes a charged particle beam emitter configured for emission of a primary charged particle beam, a specimen stage configured for supporting the specimen, an objective lens configured for focusing the primary charged particle beam onto the specimen, a beam separator configured for separating the primary charged particle beam and a signal charged particle beam formed upon impact of the primary charged particle beam onto the specimen, and at least one detector configured for detection of at least a portion of the signal charged particles of the signal charged particle beam. The charged particle beam device further includes at least one of an energy filter positioned between the specimen and the at least one detector, wherein the energy filter is configured for filtering of the signal charged particles such that signal charged particles, in an energy range from an energy of 85% of the landing energy to 100% of the landing energy, propagate to the at least one detector for subsequent detection, and an aberration correction device positioned between the specimen and the at least one detector, wherein the aberration correction device is configured to reduce at least one of chromatic aberration and spherical aberration of the portion of the signal charged particles.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (referred to as "primary charged particle beam"), signal charged particles, such as backscattered electrons (BSE), are created, which may carry information about the topography of the specimen, its chemical constituents, its electrostatic potential and others. The signal charged particles can be collected and guided to a sensor, e.g., a scintillator with subsequent camera, an array detector, a CCD array, or the like. Specifically, a substantially complete specimen field can be imaged onto the sensor.

When imaging of 3D structures, such as deep vias, a high resolution and a high throughput are beneficial. As an example, a resolution provided by a charged particle beam device can be affected by aberrations, such as chromatic aberration and spherical aberration, caused by the optical system of the charged particle beam device. A small number of signal charged particles available for detection can reduce a throughput of the charged particle beam device, specifically due to long measurement times.

The present disclosure provides a method and a charged particle beam device that improve the detection of signal charged particles, in particular of backscattered electrons. Specifically, the signal charged particles are energy filtered and/or aberration corrected before the signal charged particles are detected by the at least one detector. The signal charged particles, such as the backscattered electrons, are efficiently collected and used in the imaging of the 3D structures. A resolution and a throughput of the charged particle beam device can be improved.

Figure 1A:
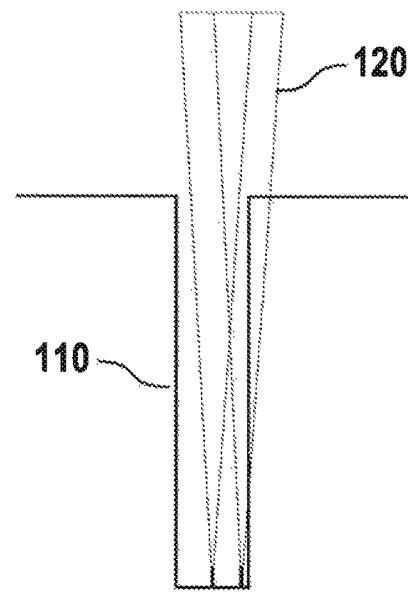
FIGS. 1A and B show schematic views of an imaging of 3D structures according to embodiments described herein.
Figure 1B:
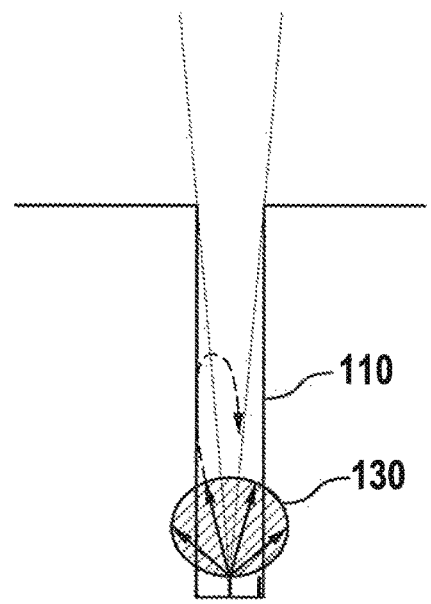

FIGS. 1A and B show schematic views of a 3D structure that can be inspected with a charged particle beam device according to the present disclosure. The 3D structures shown in FIGS. 1A and B are deep vias 110. A primary charged particle beam 120 with vertical incidence can be used for imaging the 3D structures. The term "vertical incidence" can be understood in the sense that the primary charged particle beam 120 is substantially parallel to an optical axis of the charged particle beam device. The optical axis can extend along a z-direction. The term "substantially parallel" relates to a substantially parallel orientation e.g. of the primary charged particle beam 120 and the optical axis, wherein a deviation of a few degrees, e.g. up to 1° or even up to 2°, from an exact parallel orientation is still considered as "substantially parallel". As indicated in FIG. 1A, the primary charged particle beam 120 is scanned in a scanning direction over the structure to be imaged. FIG. 1B illustrates a signal charged particle distribution 130.

As illustrated in FIG. 1B, an imaging of the bottom of deep vias or deep holes, specifically with an aspect ratio of more than 10, can be challenging. Due to large aperture angles, the primary charged particle beam cannot "see" the whole bottom and/or the side walls of the deep vias, for example, during a scan. An extraction of the signal charged particles can be difficult due to side wall charging. Signal charged particles, specifically backscattered electrons, from the bottom create secondary electrons at the side walls, and the noise and the number of unspecific electrons is increased. Moreover, only signal charged particles leaving with small aperture angles can be detected, for example, on an axial detector.

According to some embodiments, small angle backscattered electrons imaging on a detector, such as an axial or off-axis detector, can be used. Since the number of signal charged particles that are generated and/or collected can be small, the present disclosure uses energy filtering and/or aberration correction for the signal charged particles before the signal charged particles are detected by the at least one detector. The signal charged particles, such as the backscattered electrons, are efficiently collected and used for the imaging of the 3D structures. A resolution and a throughput of the charged particle beam device can be improved.

A "specimen" as referred to herein, includes, but is not limited to, semiconductor wafers, semiconductor workpieces, and other workpieces such as memory disks and the like. Embodiments of the disclosure may be applied to any workpiece on which material is deposited or workpiece which is structured. The structure can be a 3D-structure, such as deep vias, V-NAND devices, FinFets and the like.

Figure 2:
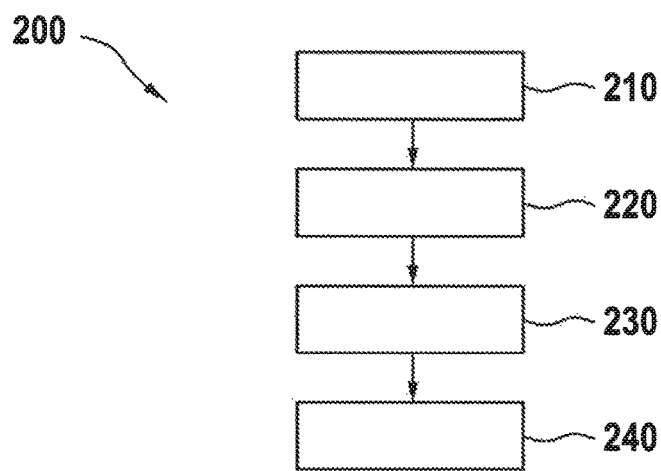
FIG. 2 shows a flowchart of a method for detecting signal charged particles in a charged particle beam device according to embodiments described herein.

FIG. 2 shows a flowchart of a method 200 of detecting signal charged particles in a charged particle beam device according to embodiments described herein.

According to an aspect of the present disclosure, the method includes, in block 210, emitting of a primary charged particle beam. The method includes, in block 220, illuminating a specimen with the primary charged particle beam, wherein the primary charged particle beam has a landing energy on the specimen of less than 40 keV, and wherein signal charged particles with a first energy spectrum are generated. According to some embodiments, the method includes, in block 230, energy filtering the signal charged particles such that signal charged particles, in an energy range from an energy of 85% of the landing energy to 100% of the landing energy, propagate for subsequent detection. The method includes, in block 240, detecting the signal charged particles within the energy range using at least one detector.

According to some embodiments, which can be combined with other embodiments described herein, the signal charged particles are backscattered electrons. Backscattered electrons (BSE) consist of electrons originating in the primary charged particle beam that are reflected or backscattered from the specimen by elastic scattering interactions with specimen atoms. In contrast thereto, secondary electrons can be understood as electrons generated by specimen interactions with the primary charged particles and/or the backscattered electrons. Secondary electrons can have an energy of less than 50 eV.

Figure 3:
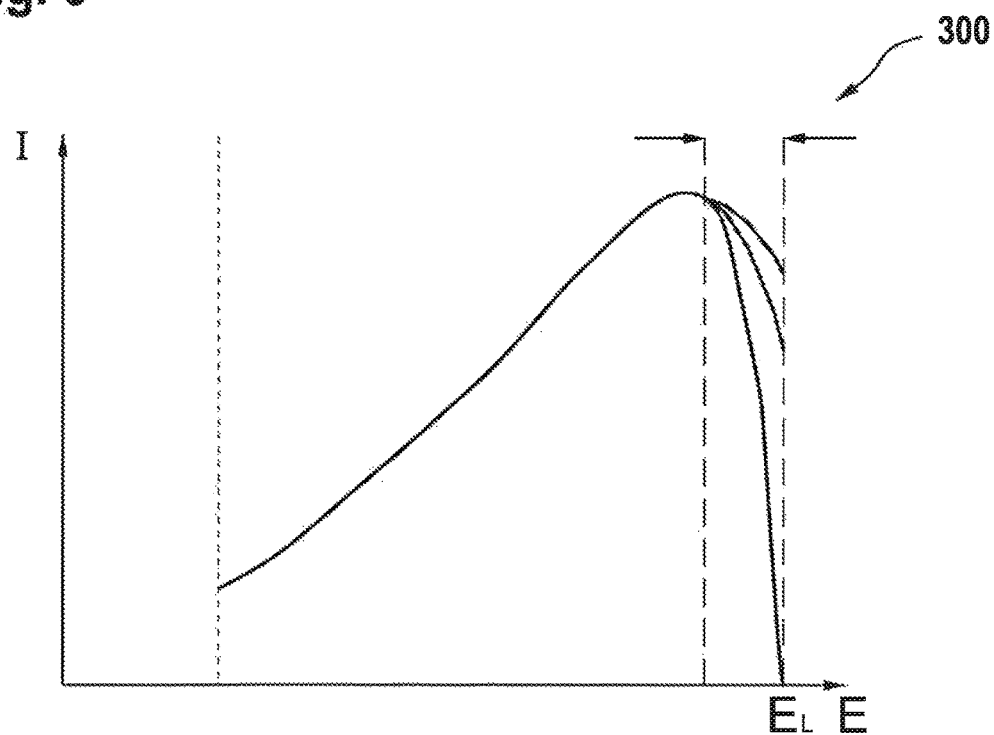
FIG. 3 shows an energy spectrum of signal charged particles illustrating the energy filtering according to embodiments described herein.

FIG. 3 shows examples of energy distributions, for example, of the first energy spectrum of signal charged particles originating from the specimen. The x-axis denotes an energy E of the signal charged particles, and the y-axis denotes an intensity or number of the signal charged particles. The landing energy of the primary charged particles is denoted with "$E_L$". As indicated in FIG. 2, a shape of the curves of the energy distribution may depend on the landing energy of the primary charged particle beam on the specimen and/or a material of the specimen.

In some embodiments, the first energy spectrum is comprised of signal charged particles having an energy in a range of about 50 eV to the landing energy $E_L$, specifically in a range of about 50 eV to about 40 keV, specifically in a range of about 50 eV to about 10 keV, and more specifically in a range of about 50 eV to about 3 keV. As an example, a minimum energy of the signal charged particles, for example, of the backscattered electrons, can be about 50 eV, as indicated with the dashed line on the left side of the graph in FIG. 3.

The energy filtering of the present disclosure "cuts out" or extracts the high energy range (energy range 300), such as a second energy range, from the first energy spectrum of the signal charged particles. The energy range is from an energy of 85% of the landing energy to 100%, specifically from an energy of 90% of the landing energy to 100% of the landing energy, and more specifically from an energy of 95% of the landing energy to 100% of the landing energy.

The energy range 300 can be a high-end energy range or a high-energy portion of the first energy range. As an example, the energy range 300 can correspond to less than 20%, specifically less than 10%, and more specifically less than 5% of the signal charged particles having the highest energies in the first energy spectrum. The small energy window of the signal charged particles used for detection allows for an improved resolution of the charged particle beam device. Specifically, the small energy window is beneficial in view of aberration, such as chromatic aberration. Adverse effects of chromatic aberration on the resolution are reduced when using the small energy window.

As an example, the landing energy of the primary charged particle beam can be 3 keV. Signal charged particles with energies between 50 eV and 3 keV can be generated upon impact of the primary charged particle beam on the specimen. Energy filtering can be performed to filter the signal charged particles to generate the second energy spectrum. The second energy spectrum is comprised of signal charged particles having an energy in the range of 2.7 keV to 3 keV.

According to some embodiments, which can be combined other embodiments described herein, the landing energy is less than 15 keV, specifically less than 10 keV, specifically less than 3 keV, and more specifically less than lkeV. As an example, the landing energy is in a range of 3 keV to 10 keV, and specifically in a range of 3 keV to 6 keV.

According to some embodiments, which can be combined with other embodiments described herein, the method further includes reducing the energy of the primary charged particle beam to the landing energy using a decelerating objective lens. As an example, an energy of the primary charged particle beam in a column of the charged particle beam device can be considerably higher than the landing energy. In some implementations, the energy of the primary charged particle beam in the column can be at least 30 keV, specifically at least 50 keV, and more specifically at least 10 keV.

In some embodiments, the energy of the primary charged particle beam is reduced by at least 50%, specifically at least 60%, specifically at least 70%, and more specifically at least 80%. According to some embodiments, the energy of the primary charged particle beam is reduced from at least 10 keV to less than 3 keV. For example, the absolute energy width can be reduced, e.g., from 50 eV-10 kev (10 keV landing energy) to 50 eV-3 keV (3 keV landing energy). The reduction of the landing energy using the decelerating objective lens allows to reduce a width of the first energy spectrum and of the energy spectrum used in the detection, for example, the second energy spectrum. Effects of chromatic aberration can be further reduced, and a resolution of the charged particle beam device can be further improved. The reduction of the landing energy can be further beneficial, since an acceleration lens for the signal charged particle beam can provide reduced chromatic aberration.

According to some embodiments, which can be combined with other embodiments described herein, the energy filtering can use one or more filter lenses (also referred to as "high pass") and/or one or more monochromators. The one or more filter lenses are described with respect to FIG. 4, and the one or more monochromators are described with respect to FIG. 5.

In some implementations, the method further includes performing an aberration correction of at least a portion of the signal charged particles of the first energy spectrum or the second energy spectrum before detection.

According to an aspect of the present disclosure, a method for detecting signal charged particles in a charged particle beam device is provided. The method includes emitting a primary charged particle beam, illuminating a specimen with the primary charged particle beam, wherein the primary charged particle beam has a landing energy on the specimen of less than 40 keV, wherein signal charged particles with a first energy spectrum are generated, and wherein the signal charged particles are backscattered electrons, performing an aberration correction of at least a portion of the signal charged particles, and detecting the aberration corrected portion of the signal charged particles using at least one detector.

According to some embodiments, the method includes the aberration correction and does not include the energy filtering described above. In other embodiments, the method includes both the aberration correction and the energy filtering.

According to some embodiments, which can be combined with other embodiments described herein, performing the aberration correction includes a correction of at least one of chromatic aberration and spherical aberration. As an example, one or more aberration correction devices configured for introducing a correction dispersion in the signal charged particle beam can be used. The aberration correction device can include one or more multiple correctors.

"Chromatic aberration" is understood in the sense that the optical system, such as lenses, of the charged particle beam device fail to focus all wavelengths of a charged particle beam, such as the signal charged particle beam, to the same convergence point. "Spherical aberration" is understood in the sense that a deflection of a charged particle beam in a lens depends on a radial position of the charged particles with respect to a center of the lens.

In some implementations, the energy filtering of the signal charged particles of the first energy spectrum is such that signal charged particles, in an energy range from an energy of 85% of the landing energy to 100% of the landing energy, propagate for subsequent aberration correction. Specifically, the signal charged particles can first be aberration corrected and can then be energy filtered using the embodiments of the present disclosure. Performing both aberration correction and energy filtering allows for a further improvement of the resolution of the charged particle beam device.

According to embodiments described herein, the method for detecting signal charged particles in a charged particle beam device can be conducted by means of computer programs, software, computer software products and the interrelated controllers, which can have a CPU, a memory, a user interface, and input and output means being in communication with the corresponding components of the charged particle beam device.

Figure 4:
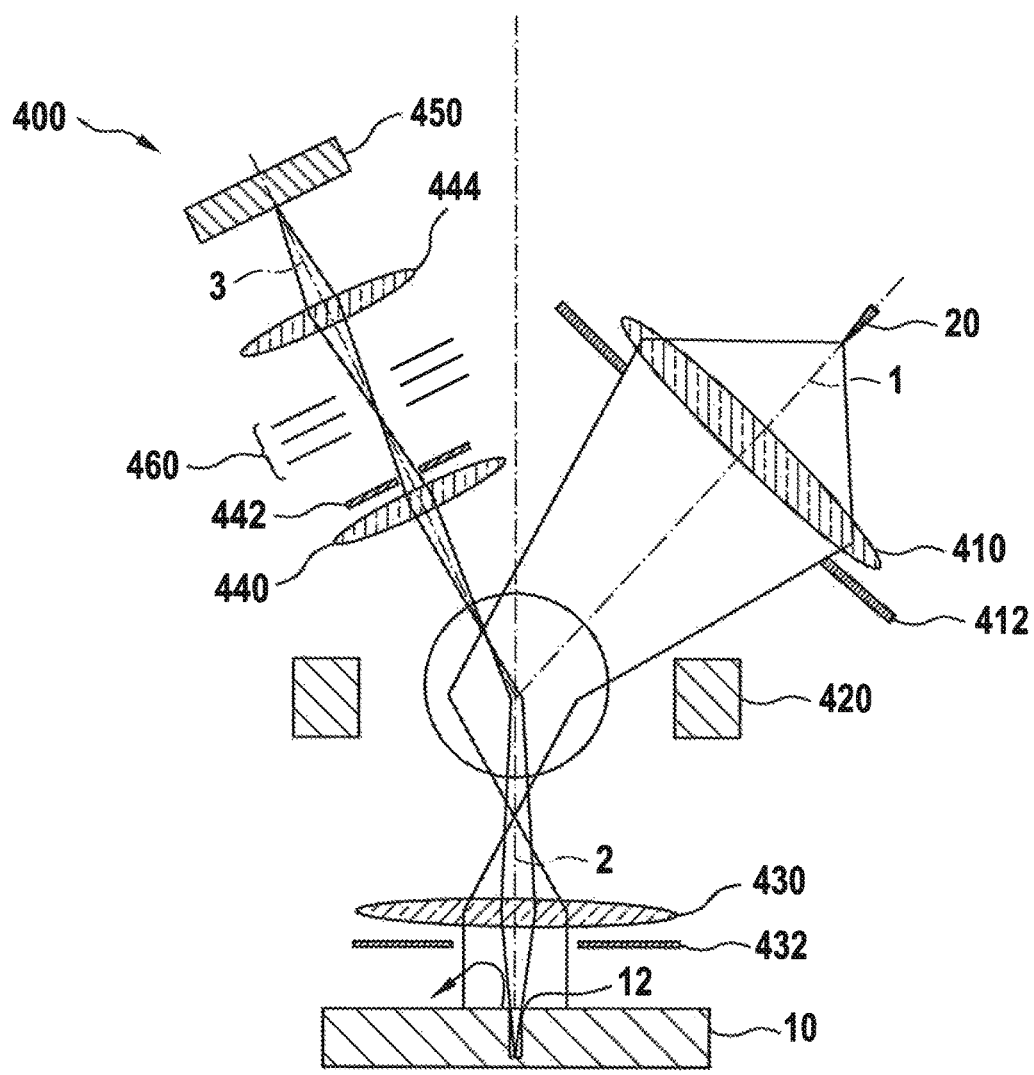
FIG. 4 shows a schematic view of a charged particle beam device according to embodiments described herein.

FIG. 4 shows a schematic view of a charged particle beam device 400 according to embodiments described herein. The charged particle beam device 400 can be, for example, an electron microscope for at least one of electron beam inspection, for defect review or for critical dimensioning. The charged particle beam device 400 of the present disclosure is configured for performing the method according to the embodiments described herein. The method of the present disclosure can be implemented using the charged particle beam devices according to the embodiments described herein.

The charged particle beam device 400 includes a charged particle beam emitter 20 configured for emission of the primary charged particle beam 1, a specimen stage configured for supporting the specimen 10, an objective lens 430 configured for focusing the primary charged particle beam 1 onto the specimen 10, a beam separator 420 configured for separating the primary charged particle beam 1 and a signal charged particle beam 3 formed upon impact of the primary charged particle beam 1 onto the specimen 10, and at least one detector 450 configured for detection of at least a portion of the signal charged particles of the signal charged particle beam 3. The specimen 10 (also referred to as sample) can be biased to ground or a column potential, or can be biased to a retarding field potential. The specimen 10 can have a feature 12 to be inspected, for example, a deep via.

The charged particle beam emitter 20 can be a thermal cathode, a thermal field emission (TFE) or Schottky emitter, a cold field emission cathode, or a photo cathode. At least one of an emitter lens (gun lens; not shown), a condenser 410, and an aperture 412 can be provided between the charged particle beam emitter 20 and the beam separator 420. The emitter lens can be an electrostatic lens, a magnetic immersion lens, or a combined electrostatic and magnetic lens. The condenser 410 can be a magnetic lens, an electrostatic lens, or a combined magnetic electrostatic lens. The condenser 410 can be a single stage or multiple stage condenser. The aperture 412 (field aperture) can have a single hole or multiple holes or apertures. The aperture 412 can be a mechanical exchangeable multi-aperture.

The beam separator 420 can use a magnetic (sector) field. In some implementations, the beam separator 420 can be a combined electrostatic/magnetic deflector, for example, a Wien filter, an achromatic deflector, and the like. Specifically, the beam separator 420 can be achromatic for backscattered electrons.

The objective lens 430 defines an optical axis 2 and provides a z-coordinate. As an example, the optical axis 2 can be a straight optical axis. The objective lens 430 can be magnetic (axial or radial gap), electrostatic (triode or multiple electrodes, retarding field), or combined electrostatic-magnetic. The objective lens 430 can be a single stage or multiple stage objective lens. In some implementations, the objective lens 430 is configured to reduce an energy of the primary charged particle beam to the landing energy as described with reference to FIG. 2.

According to some embodiments, the objective lens 430 can be a retarding field objective lens for illumination and an acceleration field objective lens for imaging. The retarding field objective lens allows for reducing spherical aberration, for example, by a factor of 3. Specifically, a strong acceleration of the signal charged particles, such as the backscattered electrons, immediately after they start from the specimen reduces a "hole defined" starting angle which corresponds to an imaging aperture. An aberration coefficient of the objective lens can be reduced. A further reduction of the energy width of the signal charged particles used for detection can be conducted using the energy filter 460 to be described later.

The charged particle beam device 400 can further include a suppressor electrode 432 (also referred to as proxy electrode). The suppressor electrode 432 can be configured to suppress or deflect secondary electrons coming from the specimen 10 while allowing for the backscattered electrons to pass through a hole or aperture in the suppressor electrode 432. The suppressor electrode 432 can be an electrostatic electrode, for example, having a dual electrode arrangement for global and/or axial field control. As an example, the suppressor electrode 432 can have dynamically controllable electrodes.

According to some embodiments, which can be combined with other embodiments described herein, the charged particle beam device 400 is configured for a parallel illumination of the specimen 10 with the primary charged particle beam. The term "parallel illumination" can be understood in a sense that the primary charged particle beam 120 is substantially parallel to an optical axis of the charged particle beam device 400, such as the optical axis 2 provided by the objective lens 430. The optical axis can extend along a z-direction. The term "substantially parallel" relates to a substantially parallel orientation e.g. of the primary charged particle beam and the optical axis, wherein a deviation of a few degrees, e.g. up to 1° or even up to 2°, from an exact parallel orientation is still considered as "substantially parallel".

According to some embodiments, the charged particle beam device 400 further includes at least one of a transfer lens 440, an imaging aperture 442, and a magnification lens 444. The transfer lens 440 can be a magnetic lens, an electrostatic lens, or a combined magnetic electrostatic lens. The imaging aperture 442 can have a single hole or multiple holes or apertures. The imaging aperture 442 can be a mechanical exchangeable multi-aperture. The magnification lens 444 can be a magnetic lens, an electrostatic lens, or a combined magnetic electrostatic lens. The magnification lens 444 can be a single stage or multiple stage system. The magnification lens 444 can be configured to image the sample surface with the filtered backscattered electrons on the at least one detector 450 or sensor (a scintillator with subsequent camera, an array detector, a CCD array, or the like).

The charged particle beam device 400 includes an energy filter 460 positioned between the specimen 10 and the at least one detector 450. The energy filter 460 is configured for filtering of the signal charged particles such that signal charged particles, in an energy range from an energy of 85% of the landing energy to 100% of the landing energy, propagate to the at least one detector 450 for subsequent detection. Specifically, the energy filter 460 can be configured for energy filtering of the signal charged particles as described with reference to FIG. 2. The energy filter 460 can also be referred to as "high pass energy filter". The energy filter 460 is beneficial in view of chromatic aberration, and a resolution of the charged particle beam device 400 can be improved.

According to some embodiments, which can be combined with other embodiments described herein, the energy filter 460 can include at least one of a filter lens, such as a high pass, and a monochromator. The energy filter 460 can be positioned between the imaging aperture 442 and the magnification lens 444. However, the present disclosure is not limited thereto and the energy filter 460 can be provided at any position between the at least one detector 450 and the beam separator 420. As an example, the energy filter 460 can be positioned between the magnification lens 444 and the at least one detector 450.

Figure 5:
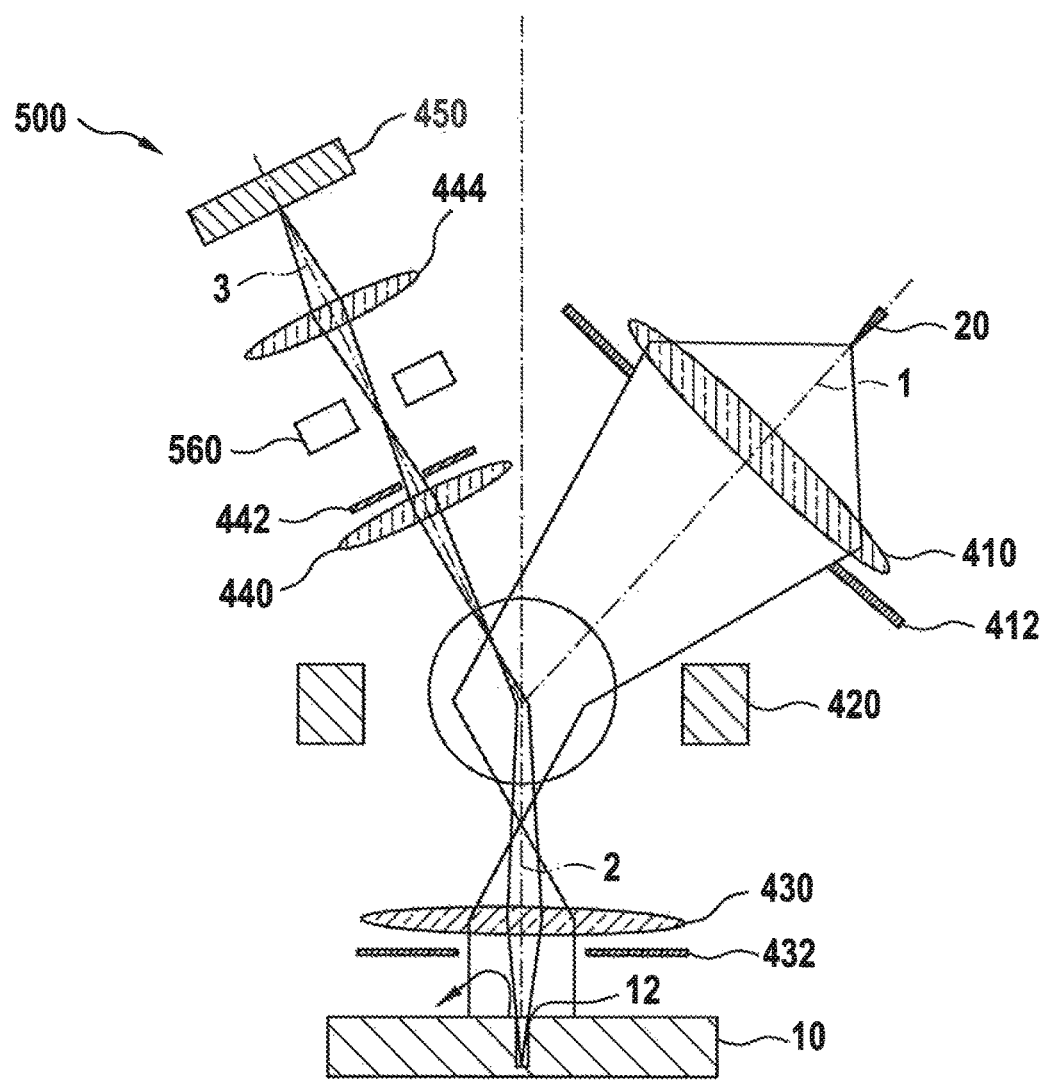
FIG. 5 shows a schematic view of a charged particle beam device according to further embodiments described herein.

FIG. 5 shows a schematic view of a charged particle beam device 500 according to further embodiments described herein. The charged particle beam device 500 is similar to the charged particle beam device 400 described with reference to FIG. 4, the difference being that the charged particle beam device 500 includes an aberration correction device 560 instead of the energy filter.

The aberration correction device 560 is positioned between the specimen 10 and the at least one detector 450. The aberration correction device 560 is configured to reduce at least one of chromatic aberration and spherical aberration of the portion of the signal charged particles that is to be detected by the at least one detector 450. The aberration correction device 560 can include one or more multiple correctors, for example, $C_s$ & $C_c$ multiple correctors.

The aberration correction device 560 can be positioned between the imaging aperture 442 and the magnification lens 444. However, the present disclosure is not limited thereto and the aberration correction device 560 can be provided at any position between the at least one detector 450 and the beam separator 420. As an example, the aberration correction device 560 can be positioned between the magnification lens 444 and the at least one detector 450.

Figure 6:
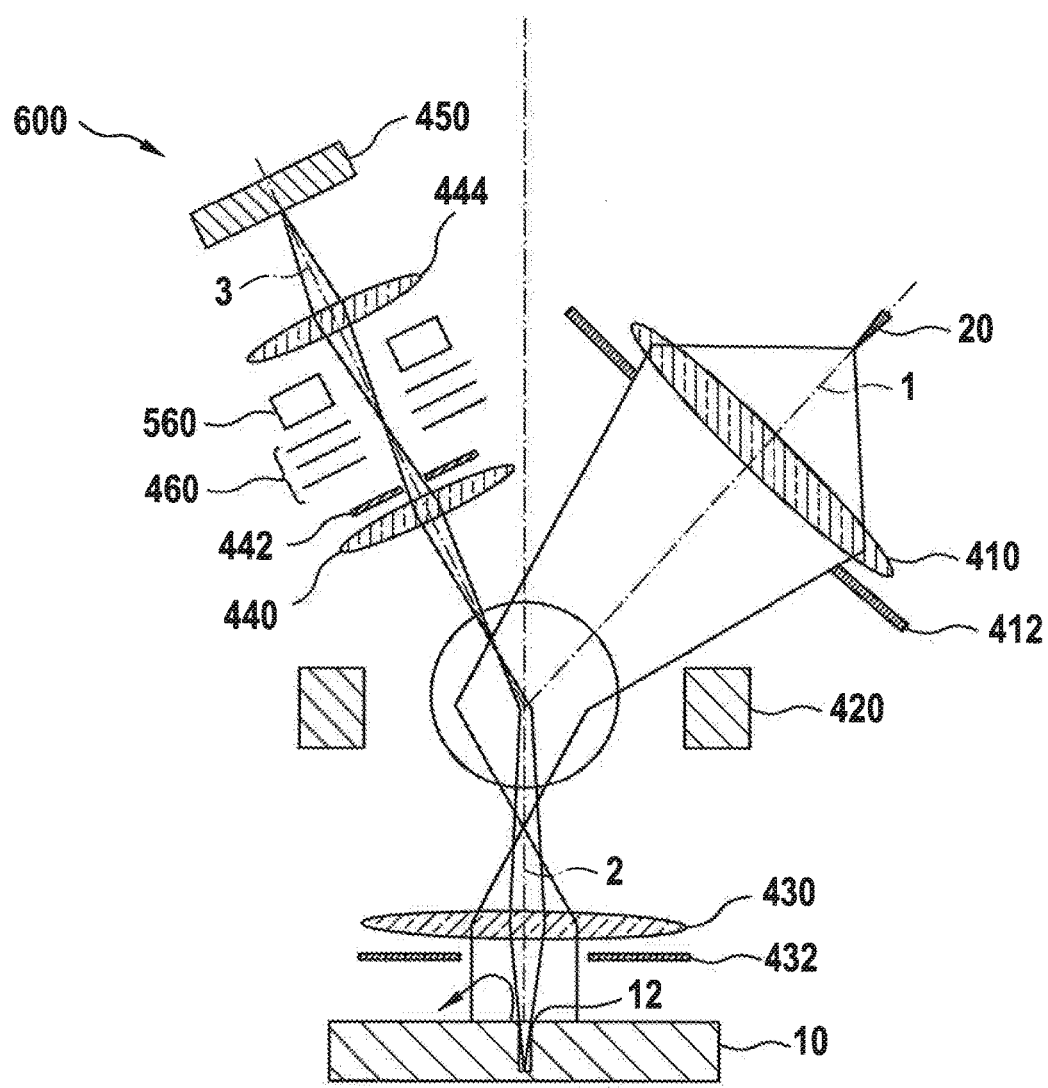
FIG. 6 shows a schematic view of a charged particle beam device according to yet further embodiments described herein.

FIG. 6 shows a schematic view of a charged particle beam device 600 according to yet further embodiments described herein. The charged particle beam device 600 can be considered a combination of the embodiments described in FIGS. 4 and 5. Specifically, the charged particle beam device 600 includes both the energy filter 460 and the aberration correction device 560.

The present disclosure provides a method and a charged particle beam device that improve the detection of signal charged particles, in particular of backscattered electrons. Specifically, the signal charged particles are energy filtered and/or aberration corrected before the signal charged particles are detected by the at least one detector. The signal charged particles, such as the backscattered electrons, are efficiently collected and used in the imaging of the 3D structures. A resolution and a throughput of the charged particle beam device can be improved.

According to some embodiments, which can be combined with other embodiments described herein, the charged particle beam device can be configured to change the detected energy range of the signal charged particles, such as the backscattered electrons. A material contrast can be visible, which can be beneficial in defect characterization (backscattered electrons are material sensitive). In some implementations, an energy filtering material analysis can be performed, for example, using Auger electron analysis.

In some embodiments, the methods and apparatuses described herein can use at least one of the following aspects: (i) a convergent illumination of the specimen can be avoided; (ii) a parallel illumination with a primary charged particle beam energy adapted to at least one of a yield of backscattered electrons, diffraction, and aberrations; (iii) a field aperture can be provided for a FOV (field of view) definition (a double condenser can be provided for higher flexibility); (iv) an objective lens having a short focal lens can be used, for example, a cathode lens or another lens; (v) secondary electrons can be suppressed, for example, using a negative cap/proxy voltage; (vi) the specimen can be imaged in a parallel manner using low/lower loss of backscattered electrons within a magnification optics, for example, in a LEEM type configuration; (vii) optionally, a CFE (cold field electron) cathode can be applied for higher probe currents.

While the foregoing is directed to embodiments of the disclosure, other and further embodiments of the disclosure may be devised without departing from the basic scope thereof, and the scope thereof is determined by the claims that follow.

The invention claimed is:

1. A method for detecting signal charged particles in a charged particle beam device, comprising:
   emitting a primary charged particle beam;
   illuminating a specimen with the primary charged particle beam, wherein the primary charged particle beam has a landing energy on the specimen of less than 40 keV, and wherein signal charged particles with a first energy spectrum are generated;
   separating the primary charged particle beam and the signal charged particles using a beam separator;
   energy filtering the signal charged particles using an energy filter such that the signal charged particles, in an energy range from an energy of 85% of the landing energy to 100% of the landing energy, propagate for subsequent detection;
   performing an aberration correction of at least a portion of the signal charged particles using an aberration correction device; and
   detecting the signal charged particles within the energy range using at least one detector, wherein the energy filtering and the aberration correction occur after the primary charged particle beam the particles are separated and before the signal charged particles are detected.

2. The method of claim 1, wherein the signal charged particles are backscattered electrons.

3. The method of claim 1, wherein the aberration correction is of the signal charged particles of the first energy spectrum or the signal charged particles of the energy range.

4. A method for detecting signal charged particles in a charged particle beam device, comprising:
   emitting a primary charged particle beam;
   illuminating a specimen with the primary charged particle beam, wherein the primary charged particle beam has a landing energy on the specimen of less than 40 keV, wherein signal charged particles with a first energy spectrum are generated, and wherein the signal charged particles are backscattered electrons;
   separating the primary charged particle beam and the signal charged particles using a beam separator;
   energy filtering the signal charged particles of the first energy spectrum such that the signal charged particles, in an energy range from an energy of 85% of the landing energy to 100% of the landing energy, propagate for subsequent detection;
   performing an aberration correction of at least a portion of the signal charged particles using an aberration correction device; and detecting the aberration corrected portion of the signal charged particles using at least one detector, wherein the energy filtering and the aberration correction occur after the primary charged particle beam and the signal charged particles are separated and before the signal charged particles are detected.

5. The method of claim 4, wherein performing the aberration correction includes a correction of at least one of chromatic aberration and spherical aberration.

6. The method of claim 4, wherein the signal charged particles in the energy range propagate for subsequent aberration correction.

7. The method of claim 4, wherein the first energy spectrum is comprised of the signal charged particles having an energy in a range of 50 eV to the landing energy.

8. The method of claim 4, wherein the landing energy is less than 30 keV, less than 15 keV, or less than 1 keV.

9. The method of claim 4, further including:
reducing an energy of the primary charged particle beam to the landing energy using a decelerating objective lens.

10. The method of claim 9, wherein the energy of the primary charged particle beam is reduced by at least 50% or at least 70%.

11. The method of claim 9, wherein the energy of the primary charged particle beam is reduced from at least 10 keV to less than 3 keV.

12. A charged particle beam device, comprising:
a charged particle beam emitter configured for emission of a primary charged particle beam;
a specimen stage configured for supporting a specimen;
an objective lens configured for focusing the primary charged particle beam onto the specimen;
a beam separator configured for separating the primary charged particle beam and a signal charged particle beam formed upon impact of the primary charged particle beam onto the specimen; and
at least one detector configured for detection of at least a portion of signal charged particles of the signal charged particle beam,
wherein the charged particle beam device further includes:
an energy filter separate from the beam separator positioned between the beam separator and the at least one detector, wherein the energy filter is configured for filtering of the signal charged particles such that the signal charged particles, in an energy range from an energy of 85% of a landing energy to 100% of the landing energy, propagate to the at least one detector for subsequent detection; and
an aberration correction device separate from the beam separator positioned between the beam separator and the at least one detector, wherein the aberration correction device is configured to reduce at least one of chromatic aberration and spherical aberration of the portion of the signal charged particles.

13. The charged particle beam device of claim 12, wherein the objective lens is configured to reduce an energy of the primary charged particle beam to the landing energy by at least 50% or at least 70%.

14. The charged particle beam device of claim 12, wherein the charged particle beam device is an electron microscope for at least one of electron beam inspection, for defect review or for critical dimensioning.

15. A charged particle beam device, comprising:
a charged particle beam emitter configured for emission of a primary charged particle beam;
a specimen stage configured for supporting a specimen;
an objective lens configured for focusing the primary charged particle beam onto the specimen;
a beam separator configured for separating the primary charged particle beam and a signal charged particle beam formed upon impact of the primary charged particle beam onto the specimen; and
at least one detector configured for detection of at least a portion of signal charged particles of the signal charged particle beam;
wherein the charged particle beam device further includes at least one of:
an energy filter positioned between the specimen and the at least one detector, wherein the energy filter is configured for filtering of the signal charged particles such that the signal charged particles, in an energy range from an energy of 85% of a landing energy to 100% of the landing energy, propagate to the at least one detector for subsequent detection; and
an aberration correction device positioned between the specimen and the at least one detector, wherein the aberration correction device is configured to reduce at least one of chromatic aberration and spherical aberration of the portion of the signal charged particles;
wherein the charged particle beam device is configured for performing the method of claim 1.

* * * * *